(12) United States Patent
Markov et al.

(10) Patent No.: US 12,727,159 B2
(45) Date of Patent: Sep. 1, 2026

(54) NON-VOLATILE MEMORY CELL WITH ONO COMPOUND INSULATION LAYER BETWEEN FLOATING AND CONTROL GATES AND A METHOD OF FABRICATION

(71) Applicant: Silicon Storage Technology, Inc., San Jose, CA (US)

(72) Inventors: Viktor Markov, Santa Clara, CA (US); Jong-Won Yoo, Morgan Hill, CA (US); Jinho Kim, Saratoga, CA (US); Nhan Do, Saratoga, CA (US); Alexander Kotov, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 337 days.

(21) Appl. No.: 18/655,196

(22) Filed: May 3, 2024

(65) Prior Publication Data

US 2025/0234536 A1 Jul. 17, 2025

Related U.S. Application Data

(60) Provisional application No. 63/622,000, filed on Jan. 17, 2024.

(51) Int. Cl.
*H10B 41/30* (2023.01)
*H10D 30/01* (2025.01)
(Continued)

(52) U.S. Cl.
CPC ......... *H10B 41/30* (2023.02); *H10D 30/0411* (2025.01); *H10D 30/68* (2025.01); *H10D 30/6892* (2025.01); *H10D 64/035* (2025.01)

(58) Field of Classification Search
CPC .... H10B 41/30; H10D 30/0411; H10D 30/68; H10D 30/6892; H10D 64/035
(Continued)

(56) References Cited

U.S. PATENT DOCUMENTS 7,400,010 B2 7/2008 Matsuno
7,615,450 B2 11/2009 Choi
(Continued)

FOREIGN PATENT DOCUMENTS

TW 201436113 A 9/2014

OTHER PUBLICATIONS

PCT Search Report and Written Opinion mailed on Dec. 5, 2024 corresponding to the related PCT Patent Application No. PCT/US2024/028056.

(Continued)

*Primary Examiner* — Monica D Harrison
(74) *Attorney, Agent, or Firm* — DLA Piper LLP (US)

(57) ABSTRACT

A method comprises forming a first insulation layer on an upper surface of a semiconductor substrate, forming a first conductive layer on the first insulation layer, and forming a compound insulation layer on the first conductive layer, wherein the compound insulation layer comprises a nitride sublayer between a lower oxide sublayer and an upper oxide sublayer. A second insulation layer is formed on the compound insulation layer. A trench is formed that extends through the second insulation layer, the compound insulation layer, the first conductive layer, the first insulation layer, and into the semiconductor substrate. The trench is filled with fill insulation material. The second insulation layer and an upper portion of the fill insulation material are removed. A second conductive layer is formed on the compound insulation layer, and on the fill insulation material in the trench.

10 Claims, 7 Drawing Sheets

(51) Int. Cl.
*H10D 30/68* (2025.01)
*H10D 64/01* (2025.01)

(58) Field of Classification Search
USPC .......................................................... 257/315
See application file for complete search history.

(56) References Cited

U.S. PATENT DOCUMENTS

| | | | | |
|---|---|---|---|---|
| 7,820,510 | B2 * | 10/2010 | Wang ..................... | H10B 41/30 438/257 |
| 7,868,375 | B2 | 1/2011 | Liu et al. | |
| 2001/0014503 | A1 | 8/2001 | Iguchi | |
| 2009/0085093 | A1 | 4/2009 | Jeon | |
| 2014/0339622 | A1 | 11/2014 | Murata | |

OTHER PUBLICATIONS

PCT Invitation to Pay Additional Fees mailed on Oct. 14, 2024 corresponding to the related PCT Patent Application No. PCT/US2024/028056.

Taiwanese Office Action mailed on Sep. 18, 2025 corresponding to the related Taiwanese Patent Application No. 113146167. (Attached are the English and Taiwanese Office Actions translations.).

* cited by examiner 58
56c
56
56b
56a
54
52
50c
50

NON-VOLATILE MEMORY CELL WITH ONO COMPOUND INSULATION LAYER BETWEEN FLOATING AND CONTROL GATES AND A METHOD OF FABRICATION

RELATED APPLICATIONS

This application claims the benefit of U.S. Provisional Application No. 63/622,000, filed Jan. 17, 2024, and which is incorporated herein by reference.

FIELD OF THE INVENTION

The present invention relates to non-volatile memory devices, and more particularly to improving the data retention in non-volatile memory cells by prevention of electron trapping in dielectric between floating gates.

BACKGROUND OF THE INVENTION

Non-volatile memory devices are well known in the art. See for example U.S. Pat. No. 7,868,375, which discloses a four-gate memory cell configuration, and which is incorporated herein by reference for all purposes. Specifically, FIG. 1 of the present application illustrates a pair of split gate memory cells 10 each with spaced apart source and drain regions 14/16 formed in a semiconductor substrate 12. The source region 14 can be referred to as a source line SL (because it commonly is connected to other source regions for other memory cells in the same row or column), and the drain region 16 is commonly connected to a bit line. A channel region 18 of the semiconductor substrate 12 extends between the source/drain regions 14/16. A floating gate 20 is disposed vertically over and insulated from (and directly controls the conductivity of) a first portion of the channel region 18 (and partially vertically over and insulated from the source region 14). A control gate 22 is disposed vertically over and insulated from the floating gate 20. A select gate 24 (also referred to as a word line gate) is disposed vertically over and insulated from (and directly controls the conductivity of) a second portion of the channel region 18, and partially over the drain region 16. An erase gate 26 is disposed vertically over and insulated from the source region 14 and is laterally adjacent to the floating gate 20. The erase gate 26 can include a notch that faces an edge of the floating gate 20.

A plurality of such memory cells 10 can be arranged in rows and columns to form a memory cell array, as illustrated in FIGS. 2-3. While FIG. 1 only shows a pair of memory cells 10 (sharing a common source region 14 and erase gate 26), the memory cell pairs can be placed end to end to form a column of memory cells (where the memory cell pairs can share a common drain region). While only two such columns are shown in FIG. 2 and FIG. 3, there can be many such columns. Each column can include a bit line 16*a* electrically connecting together all the drain regions 16 in the column. Each row of memory cells 10 can include a control gate line 22*a* electrically connecting together all the control gates 22 in the row of memory cells 10. For example, all the control gates 22 in each row of memory cells can be formed as a continuous line of conductive material, where a portion of the continuous line passing through any given memory cell 10 serves as its control gate 22. Each row of memory cells can include a select gate line 24*a* electrically connecting together all the select gates 24 in the row of memory cells 10. For example, all the select gates 24 in each row of memory cells 10 can be formed as a continuous line of conductive material, where a portion of the continuous line passing through any given memory cell 10 serves as its select gate 24. Each row of memory cell pairs can include an erase gate line 26*a* electrically connecting together all the erase gates 26 in the row of memory cell pairs. For example, all the erase gates 26 in each row of memory cell pairs can be formed as a continuous line of conductive material, where a portion of the continuous line passing through any given memory cell pair serves as its erase gate 26. Finally, each row of memory cell pairs can include a source line 14*a* electrically connecting together all the source regions 14 in the row of memory cell pairs. For example, all the source regions 14 in each row of memory cell pairs can be formed as a continuous line of conductive diffusion in the semiconductor substrate 12, where a portion of the continuous line passing through any given memory cell pair serves as its source region 14.

The semiconductor substrate 12 can include interleaved columns of active regions 12*a* (in which columns of the memory cells 10 are formed), and columns of isolation regions 12*b* (each isolation region 12*b* disposed between two adjacent columns of memory cells 10), as best shown in FIG. 3. Shallow trench isolation (STI) can be used in the isolation regions 12*b* to insulate adjacent columns of memory cells 10 from each other. STI can include a trench 28 formed in the isolation region 12*b* of the semiconductor substrate 12 extending in the column direction. Trench 28 can be filled with insulation material 30, such as an oxide (e.g., silicon oxide, silicon dioxide, or a combination of both).

Various combinations of voltages are applied to the control gate 22, select gate 24, erase gate 26 and/or source and drain regions 14/16, to program the split gate memory cell 10 (i.e., inject electrons onto the floating gate 20), to erase the split gate memory cell 10 (i.e., remove electrons from the floating gate 20), and to read the split gate memory cell 10 (i.e., measure or detect the conductivity of the channel region 18, by for example measuring or detecting a read current through the channel region 18, to determine the programming state of the floating gate 20).

Split gate memory cell 10 can be operated in a digital manner, where the split gate memory cell 10 is set to one of only two possible states: a programmed state and an erased state. Split gate memory cell 10 can alternately be operated in an analog manner where the memory state (i.e. the amount of charge, such as the number of electrons, on the floating gate 20) of the split gate memory cell 10 can be continuously changed anywhere from a fully erased state (minimum number of electrons on the floating gate 20) to a fully programmed state (maximum number of electrons on the floating gate 20), or just a portion of this range. This means the split gate memory cell 10 storage is analog, which allows for very precise and individual tuning the amount of current provided by each split gate memory cell 10 in an array of split gate memory cells 10. Alternatively, the split gate memory cell 10 could be operated as an MLC (multilevel cell) where it is programmed to one of many discrete values (such as 3 or more different values).

For reduction of memory cell lateral dimensions and production cost, in the fabrication of the memory cell and array of the type shown in FIGS. 1-3, it can be desirous to fabricate the floating gates 20 so that they are self-aligned to the STI trench 28 and STI insulation material 30. This can be achieved by forming an insulation layer 32 (e.g., oxide) on the upper surface 12*c* of semiconductor substrate 12, a first conductive layer 34 (e.g., polysilicon or metal) on insulation layer 32, and an insulation layer 36 (e.g., a nitride such as silicon nitride) on first conductive layer 34, as shown in FIG. 4A. The structure can then be patterned using a photolithography process (e.g., photoresist deposition, selective exposure and partial removal) to leave portions of the underlying insulation layer 36 exposed. One or more etches are used to remove the exposed portions of insulation layer 36, first conductive layer 34, insulation layer 32 and semiconductor substrate 12, leaving trenches 28 that extend into the semiconductor substrate 12. The trenches 28 can be filled with STI insulation material 30 by insulation material deposition followed by a chemical mechanical polish, leaving the structure shown in FIG. 4B. The insulation layer 36 can be removed, along with an upper portion of the STI insulation material 30, as shown in FIG. 4C, leaving the edges of the first conductive layer 34 (which will constitute the floating gates) aligned with the edges of STI trench 28 and STI insulation material 30. Thereafter, further processing can include forming insulation layer 38 on the first conductive layer 34, and forming a second conductive layer 40 on the insulation layer 38, as illustrated in FIG. 4D. The second conductive layer 40 can be patterned into strips of the conductive layer 40 to form the control gate lines 22*a* described above.

In the memory cell arrays, it is desirable to minimize electron trapping in dielectric materials surrounding floating gates, which occurs during program operation. Trapped electrons can de-trap or drift in dielectric materials and cause the undesirable change of the program state of memory cells.

BRIEF SUMMARY OF THE INVENTION

The aforementioned problems and needs are addressed by a method that comprises forming a first insulation layer on an upper surface of a semiconductor substrate, forming a first conductive layer on the first insulation layer, forming a compound insulation layer on the first conductive layer, wherein the compound insulation layer comprises a nitride sublayer between a lower oxide sublayer and an upper oxide sublayer, forming a second insulation layer on the compound insulation layer, forming a trench that extends through the second insulation layer, the compound insulation layer, the first conductive layer, the first insulation layer, and into the semiconductor substrate, filling the trench with fill insulation material, removing the second insulation layer and an upper portion of the fill insulation material, and forming a second conductive layer on the compound insulation layer, and on the fill insulation material in the trench.

A method comprises forming a first insulation layer on an upper surface of a semiconductor substrate, forming a first conductive layer on the first insulation layer, forming a second insulation layer on the first conductive layer, forming a trench that extends through the second insulation layer, the first conductive layer, the first insulation layer, and into the semiconductor substrate, filling the trench with fill insulation material, removing the second insulation layer and an upper portion of the fill insulation material, forming a compound insulation layer on the first conductive layer and on the fill insulation material in the trench, wherein the compound insulation layer comprises a nitride sublayer between a lower oxide sublayer and an upper oxide sublayer, removing portions of the upper oxide sublayer and the nitride sublayer disposed on the fill insulation material in the trench, and forming a second conductive layer on the compound insulation layer and on the lower oxide sublayer in the trench.

A semiconductor device, comprising a semiconductor substrate, a first strip of conductive material, a plurality of floating gates, a second strip of conductive material, and a third strip of conductive material. The semiconductor substrate comprises an upper surface, alternating active regions and isolation regions that have lengths extending in a parallel manner in a first direction, and respective ones of the isolation regions include a trench formed into the upper surface, having a length extending in the first direction, and containing fill insulation material filling the trench. The first strip of conductive material has a length extending in a second direction orthogonal to the first direction and is over the active regions and the isolation regions. The plurality of floating gates are disposed over and insulated from the upper surface, wherein respective ones of the floating gates are disposed in one of the active regions, between adjacent ones of the isolation regions, disposed under the first strip of conductive material, and insulated from the first strip of conductive material by a compound insulation layer, wherein the compound insulation layer comprises a nitride sublayer between a lower oxide sublayer and an upper oxide sublayer and wherein the nitride sublayer does not extend completely across the isolation regions. The second strip of conductive material has a length extending in the second direction and over the active regions and the isolation regions. The third strip of conductive material has a length extending in the second direction and over the active regions and the isolation regions. The first strip of conductive material is disposed between and insulated from the second strip of conductive material and the third strip of conductive material.

Other objects and features of the present disclosure will become apparent by a review of the specification, claims and appended figures.

BRIEF DESCRIPTION OF THE DRAWINGS

FIGS. 7A-7F are side cross sectional views illustrating a second example of the formation of the floating gate and control gate conductive layers, and the intervening shallow trench isolation (STI) regions.

DETAILED DESCRIPTION OF THE INVENTION

In the forming of floating gates of nonvolatile memory cells, such as described above with respect to FIGS. 4A-4D, it can be desirous to use a compound insulation layer (i.e., an insulation layer with sublayers of different insulation materials) as the insulation layer 38 between the first conductive layer 34 and the second conductive layer 40. One such compound insulation layer is ONO which is a compound insulation layer that includes a nitride sublayer disposed between two oxide sublayers. ONO insulation layers are known in the art and have been used as an insulation layer 38 between the first and second conductive layers 34 and 40 (i.e., ONO insulation layers have been used as an intervening insulator between the floating gates and the control gates of non-volatile memory cells).

In the memory cell array, such as described in FIGS. 4A-4D, the ONO insulation layer is continuously passing under the coupling gate lines above the floating gates and the STI insulation material between the floating gates. It has been discovered by the present inventors that in nonvolatile memory cells, such as described above, unwanted electron trapping can occur in the nitride sublayer of the ONO insulation layer above the STI insulation region during program operation. Specifically, a noticeable number of electrons can accumulate in the nitride sublayer of the ONO insulation layer due to application of multiple program operations during erase/program cycling. After cycling, accumulated electrons can de-trap from the nitride sublayer of the ONO insulation layer under either unbiased or biased conditions. Electron de-trapping can be accelerated by higher temperatures and control gate read voltage biases. The presence of electrons in the nitride sublayer of the ONO insulation layer reduces the electrostatic potential of the floating gates, which, in turn, results in the reduction of read current. As a result of electron de-trapping, a noticeable increase of the cell current can occur, which can degrade the memory cell data retention characteristics. Cell current drift could be especially detrimental for memory cells used for MLC and/or analog data storage applications, which are especially sensitive to cell current drift.

Figure 1:
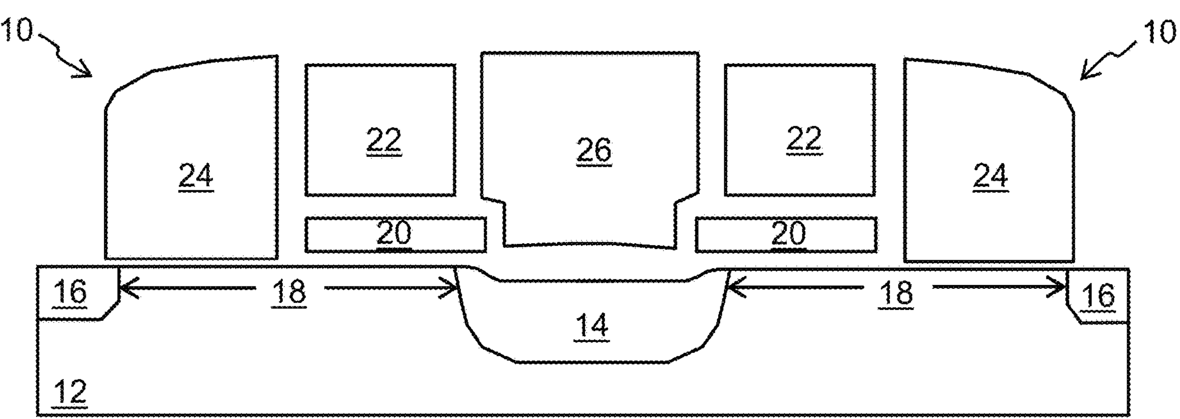
FIG. 1 is a side cross sectional view of a conventional pair of memory cells.
Figure 2:
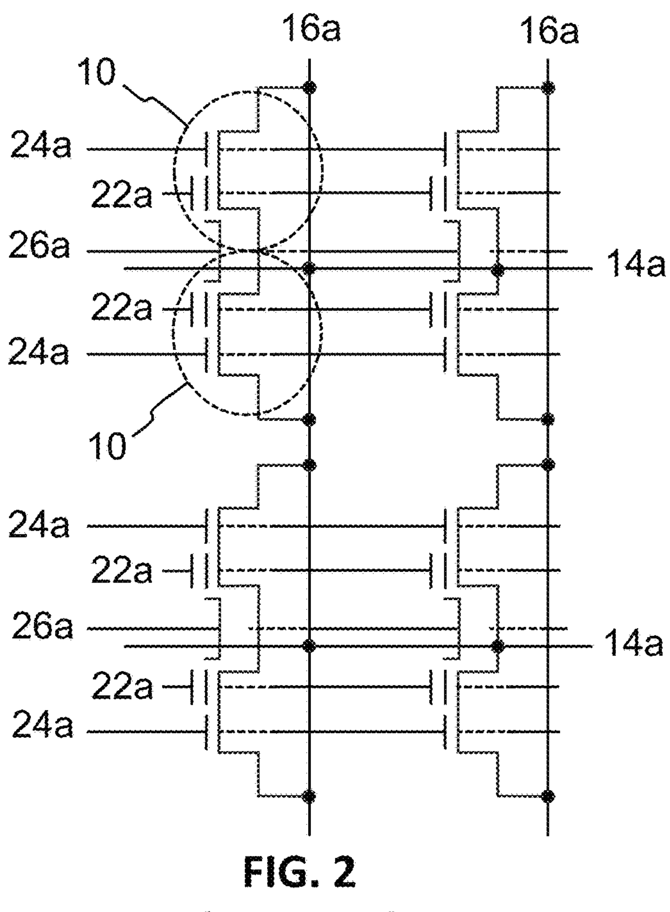
FIG. 2 is a schematic layout diagram of a conventional memory cell array of the memory cells of FIG. 1.
Figure 3:
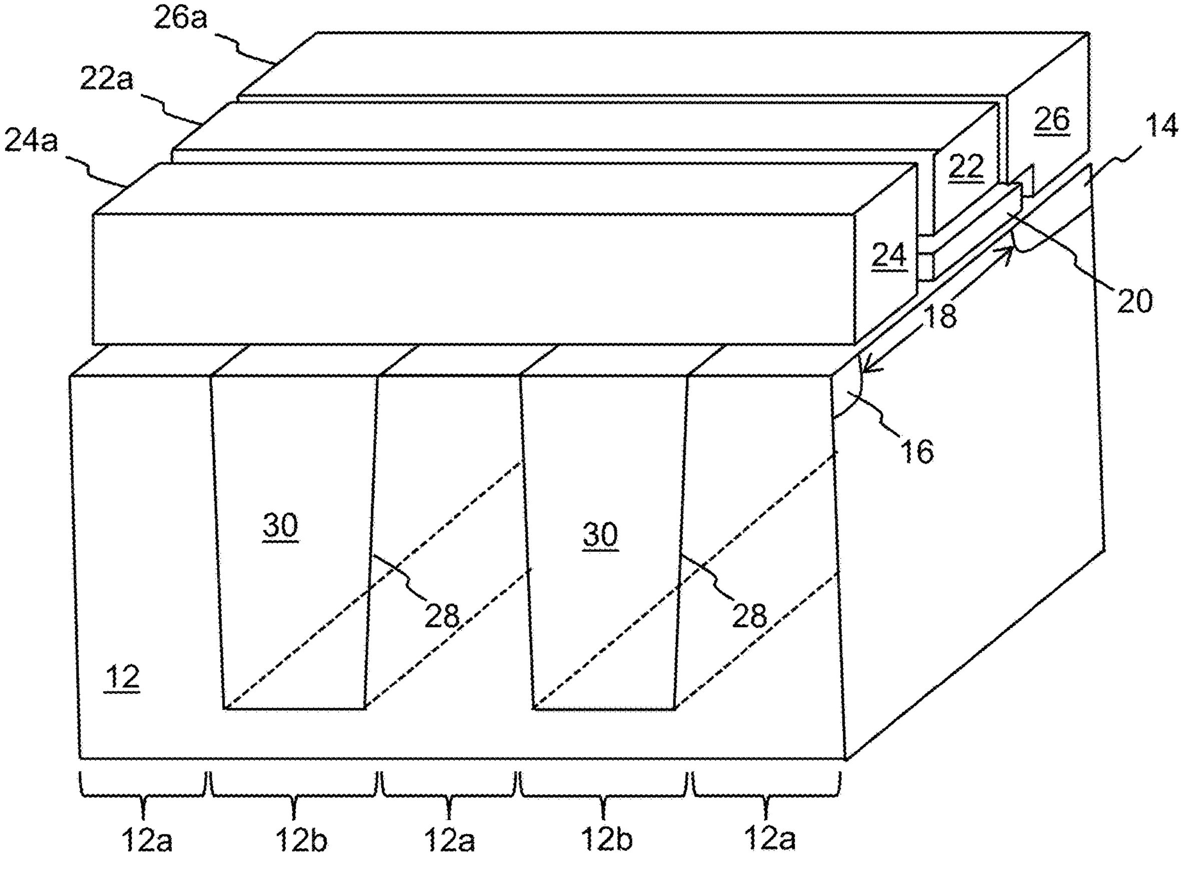
FIG. 3 is a partial perspective view of a conventional memory cell array of the memory cells of FIG. 1.
Figure 4A:
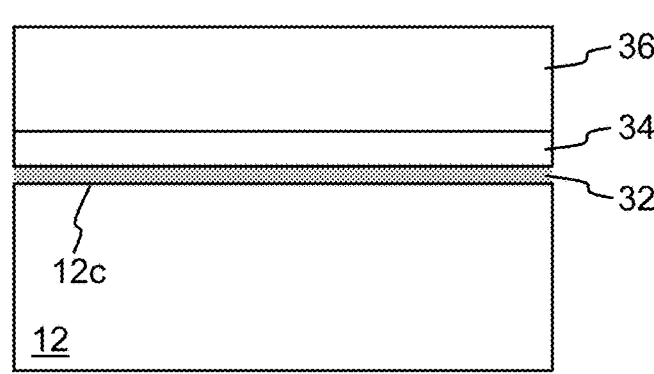
FIGS. 4A-4D are side cross sectional views illustrating conventional formation of the floating gate and control gate conductive layers, and the intervening shallow trench isolation (STI) regions.
Figure 4B:
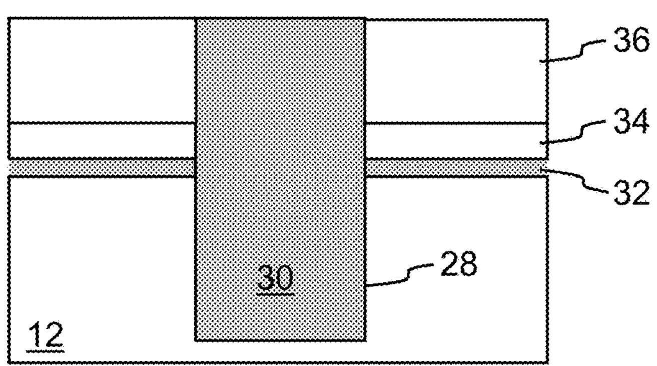
Figure 4C:
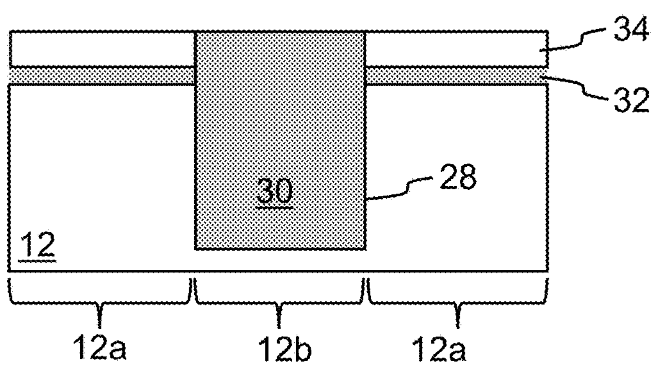
Figure 4D:
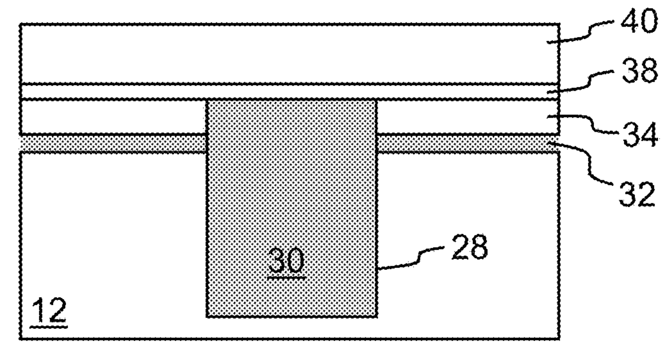
Figures 5A, 5B, 5C, 5D:
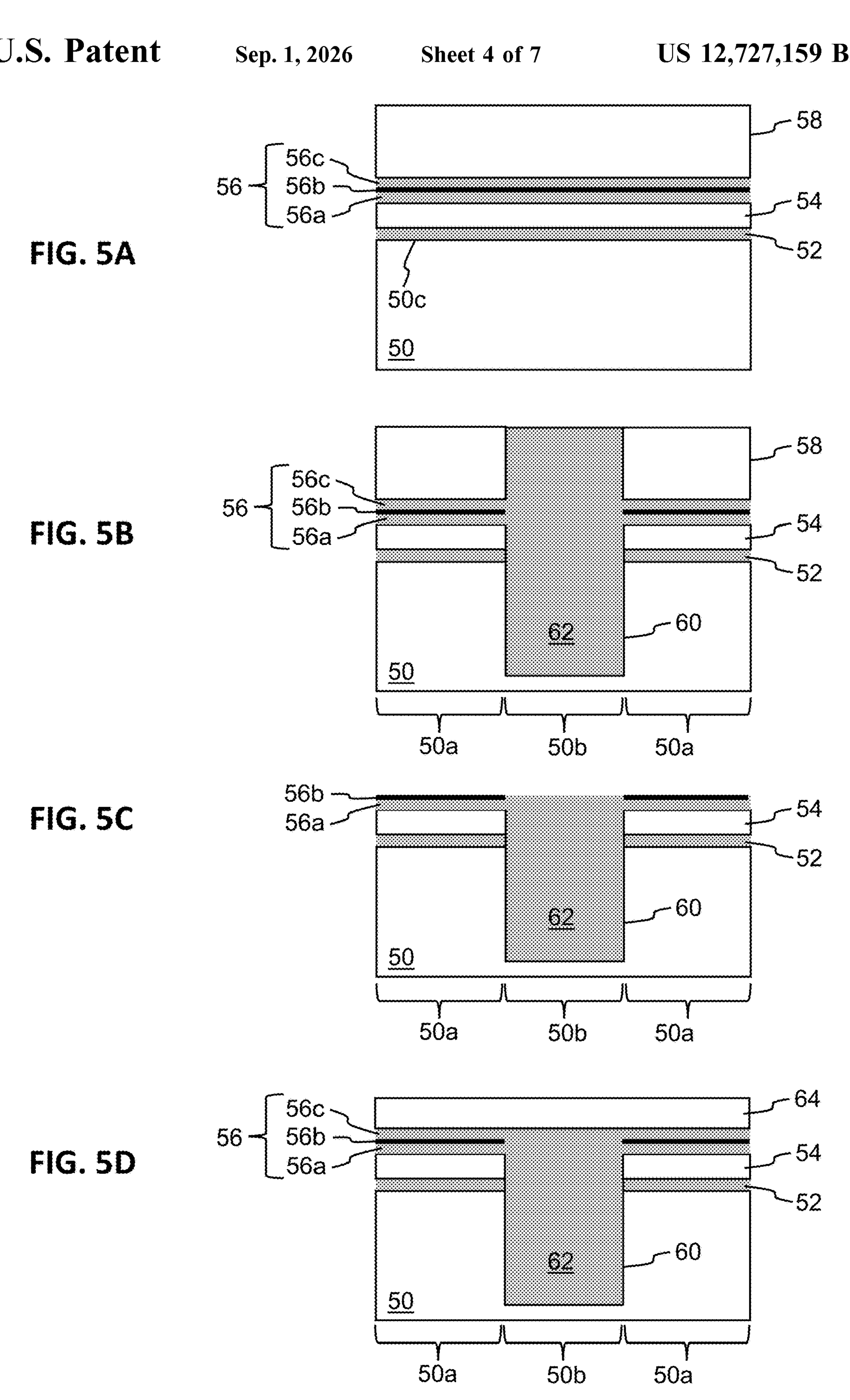
FIGS. 5A-5D are side cross sectional views illustrating a first example of the formation of the floating gate and control gate conductive layers, and the intervening shallow trench isolation (STI) regions.

It has also been discovered by the present inventors that unwanted electron trapping can be reduced or eliminated by omitting the nitride sublayer of the ONO insulation layer above the STI isolation regions, while maintaining the nitride sublayer in the areas between floating gates and control gates. FIGS. 5A-5D illustrate an example of a method of forming a semiconductor device in which the nitride sublayer can be selectively removed from the isolation regions above STI to reduce or avoid unwanted electron trapping. Active regions 50*a* are shown adjacent to isolation region 50*b*, it being understood that interleaved columns of active regions 50*a* (in which columns of the memory cells 10 are formed), and columns of isolation regions 50*b* are provided as described above in relation to FIG. 3. The method begins by forming a first insulation layer 52 (e.g., oxide) on the upper surface 50*c* of a semiconductor substrate 50, a first conductive layer 54 (e.g., polysilicon or metal) on the first insulation layer 52, an ONO insulation layer 56 (also referred to herein as compound insulation layer 56) on first conductive layer 54, and a second insulation layer 58 on the ONO insulation layer 56, as shown in FIG. 5A. The ONO insulation layer includes an upper oxide sublayer 56*c* on a nitride sublayer 56*b*, which is on a lower oxide sublayer 56*a*, (i.e., the nitride sublayer 56*b* is between the upper and lower oxide sublayers 56*c*, 56*a*, with the lower oxide sublayer 56*a* closer to the substrate 12 than the upper oxide sublayer 56*c*). The structure can then be patterned using a photolithography process (e.g., photoresist deposition, selective exposure and partial removal) to leave portions of the underlying second insulation layer 58 exposed. One or more etches are used to remove the exposed portions of second insulation layer 58, ONO insulation layer 56, first conductive layer 54, first insulation layer 52 and semiconductor substrate 50, leaving trenches 60 that extend into the semiconductor substrate 50. The trenches 60 can be filled with fill insulation material 62, also known as STI insulation material 62, by insulation material deposition followed by a chemical mechanical polish, leaving the structure shown in FIG. 5B.

The second insulation layer 58 can then be removed, along with an upper portion of the fill insulation material 62, as shown in FIG. 5C. The removal of the second insulation layer 58 can include removing the upper oxide sublayer 56*c* depending upon the type of etch used, whereby an oxide formation can be performed to re-form upper oxide sublayer 56*c*. A second conductive layer 64 can be formed on ONO insulation layer 56 in the active regions 50*a*, and which extends across the isolation regions 50*b*, i.e. across upper oxide sublayer 56*c*, as illustrated in FIG. 5D. At this stage, the edges of the first conductive layer 54 (which will constitute the floating gates) in the active regions 50*a* are aligned with the edges of STI trench 60 and fill insulation material 62 in the isolation regions 50*b*. Further, the first and second conductive layers 54, 64 are insulated from each other by ONO insulation layer 56 in the active regions 50*a*, with nitride sublayer 56*b* removed from the isolation regions 50*b*. Completion of memory cell formation can be performed by patterning second conductive layer 64 into strips to form control gate lines 64*a* that constitute the control gates 64*b* in the active regions 50*a*, and patterning first conductive layer 54 to form floating gates 54*a* (i.e., each floating gate 54*a* is disposed in one of the active regions 50*a* underneath one of the control gates 64*b*). One or more implantations can be performed to form source regions 66 and drain regions 68 in the semiconductor substrate, with channel regions 70 extending therebetween. Additional conductive material deposition and patterning can be performed to form the select gate lines 72*a* that constitute the select gates 72 in the active regions 50*a*, and the erase gate lines 74*a* that constitute the erase gates 74 in the active regions 50*a*, as shown in FIG. 6.

The method results in a semiconductor device in which memory cells 76 are respectively disposed in an active region 50*a*, with memory cells 76 having respective spaced apart source and drain regions 66/68 in semiconductor substrate 50, with a channel region 70 of the semiconductor substrate 50 that extends between the source/drain regions 66/68. A floating gate 54*a* is disposed vertically over and insulated from (and directly controls the conductivity of) a first portion of the channel region 70 (and partially vertically over and insulated from the source region 66). A control gate 64*b* is disposed vertically over the floating gate 54*a*, and is insulated therefrom by ONO insulation layer 56 (i.e., the floating gate 54*a* is under the control gate 64*b*). A select gate 72 (which can also be referred to as a word line gate) is disposed vertically over and insulated from (and directly controls the conductivity of) a second portion of the channel region 70 (and partially vertically over and insulated from the drain region 68). An erase gate 74 is disposed vertically over and insulated from the source region 66 and is laterally adjacent to the floating gate 54*a*. The erase gate 74 can include a notch 74*b* that faces an edge 54*b* of the floating gate 54*a* for enhanced erase efficiency.

Figure 6:
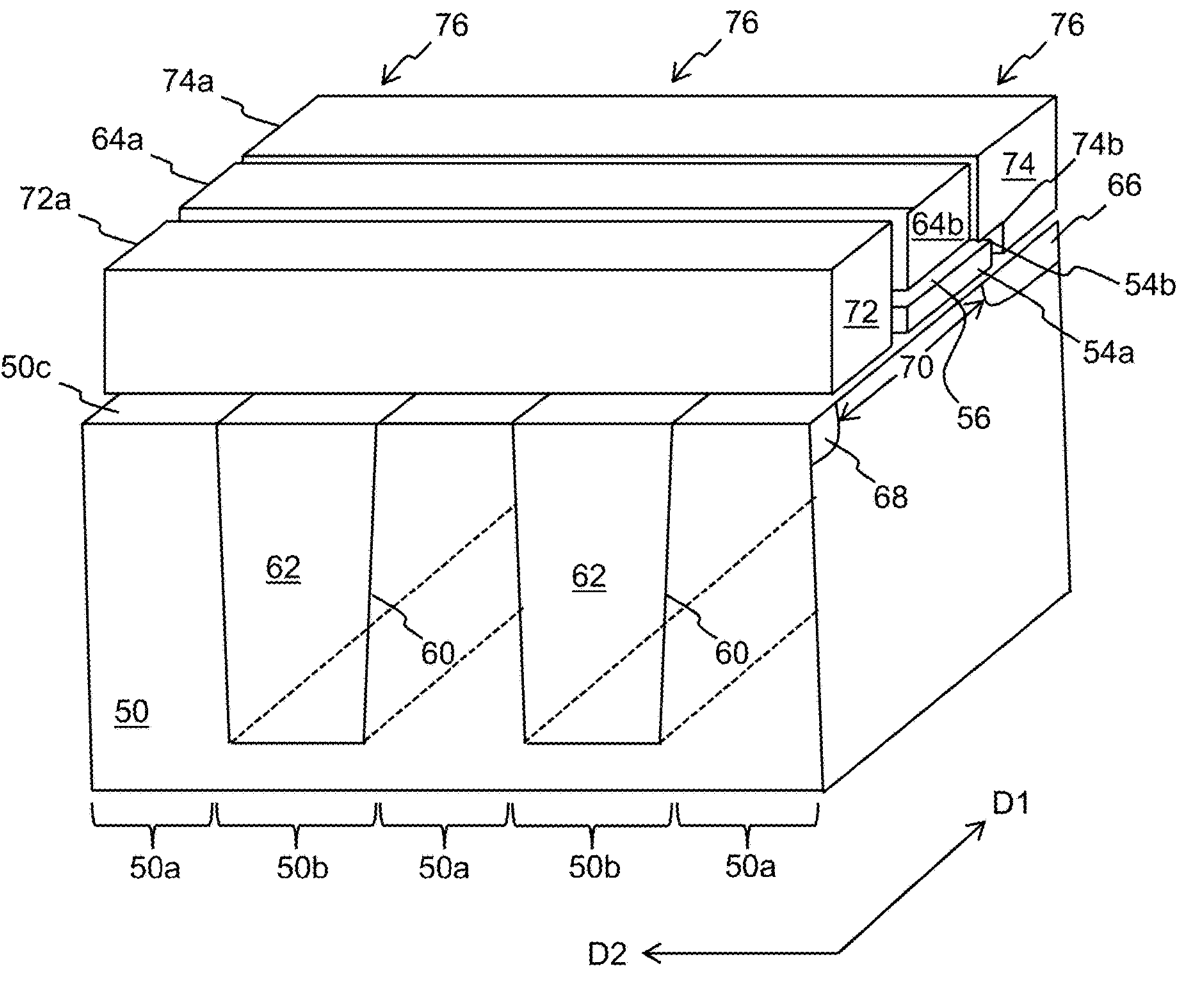
FIG. 6 is a partial perspective view of the resulting memory cell array.

As shown in FIG. 6, there are alternating active regions 50*a* and isolation regions 50*b* that have lengths extending in a parallel manner in a first direction D1. Respective ones of the isolation regions 50*b* include a trench 60 formed into the upper surface 50*c* of the semiconductor substrate 50, having a length extending in the first direction, and containing fill insulation material 62 filling the trench 60. A first strip of conductive material 64*a* (i.e. a control gate line) has a length extending in a second direction D2 orthogonal to the first direction D1 and is disposed over the active regions 50*a* and the isolation regions 50*b*. The floating gates 54*a* are disposed over and insulated from the upper surface 50*c*. Respective ones of the floating gates 54*a* are disposed in one of the active regions 50*a*, between adjacent ones of the isolation regions 50*b*, disposed under the first strip of conductive material 64*a*, and insulated from the first strip of conductive material 64*a* by compound insulation layer 56 where at least the nitride sublayer 56*b* of the compound insulation layer 56 does not extend completely across the isolation regions 50*b*. A second strip of conductive material 72*a* (i.e., the select gate line) has a length extending in the second direction D2 is disposed over the active regions 50*a* and the isolation regions 50*b*. A third strip of conductive material 74*a* (i.e., the erase gate line) has a length extending in the second direction D2 disposed over and insulated from the source region 66, wherein the first strip of conductive material 64*a* is disposed between and insulated from the second strip of conductive material 72*a* and the third strip of conductive material 74*a*.

Figures 7A, 7B, 7C, 7D:
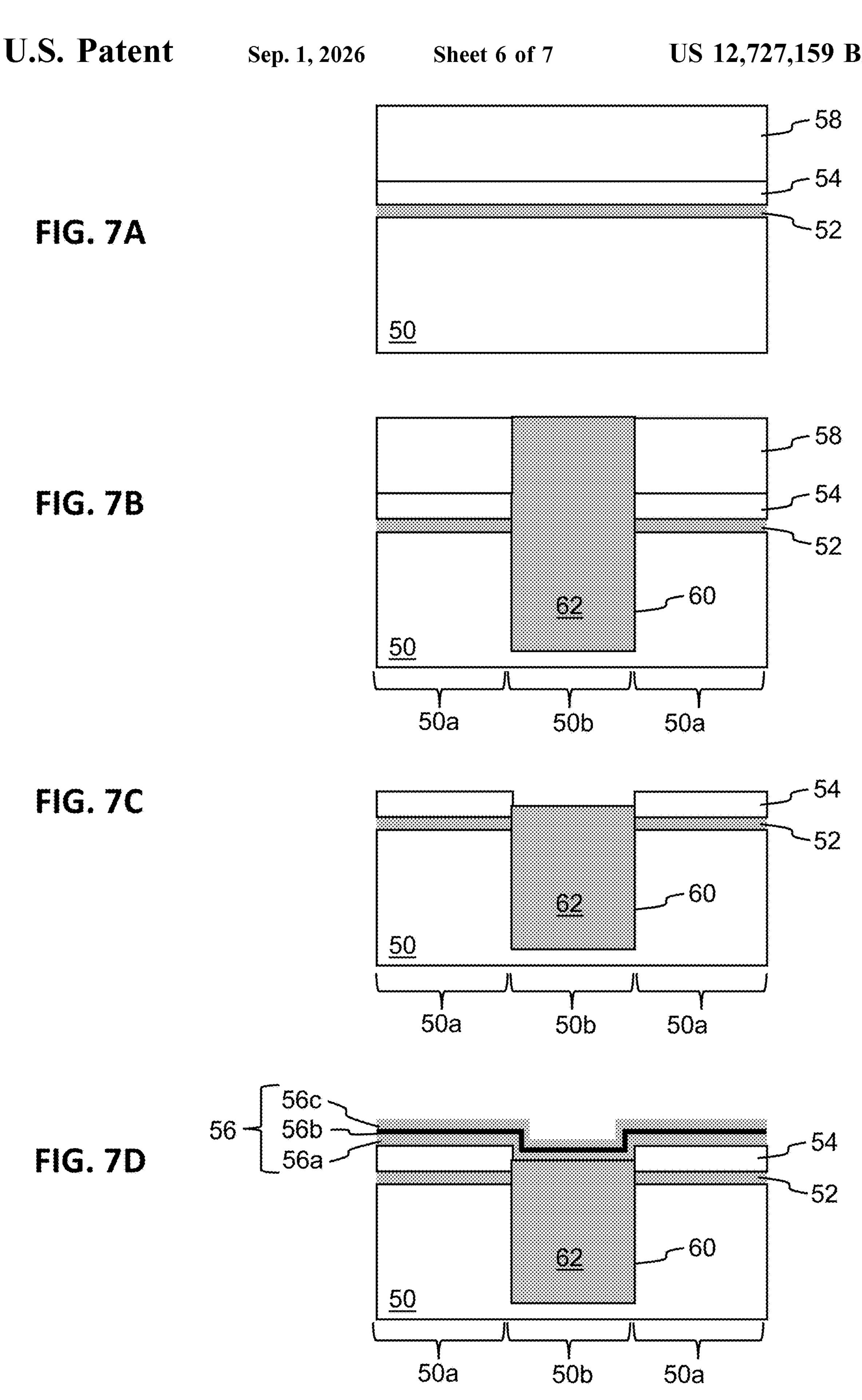

FIGS. 7A-7F illustrate another example of forming floating gates insulated from control gates with an ONO insulation layer whereby the nitride sublayer of the ONO insulation layer does not extend completely across the isolation regions 50*b*. The process begins with the same structure shown in FIG. 5A, except that the ONO insulation layer 56 is omitted (i.e., second insulation layer 58 is formed directly on first conductive layer 54, as shown in FIG. 7A). The structure can then be patterned using a photolithography process (e.g., photoresist deposition, selective exposure and partial removal) to leave portions of the underlying second insulation layer 58 exposed. One or more etches are used to remove the exposed portions of second insulation layer 58, first conductive layer 54, first insulation layer 52 and semiconductor substrate 50, leaving trenches 60 that extend into the semiconductor substrate 50. The trenches 60 can be filled with fill insulation material 62 by insulation material deposition followed by a chemical mechanical polish, leaving the structure shown in FIG. 7B. The second insulation layer 58 can be removed, along with an upper portion of the fill insulation material 62, as shown in FIG. 7C. At this stage, the upper surface of fill insulation material 62 can optionally be recessed relative to the upper surface of second insulation layer 58. ONO insulation layer 56 is then formed over the structure, as shown in FIG. 7D.

Figures 7E, 7F:
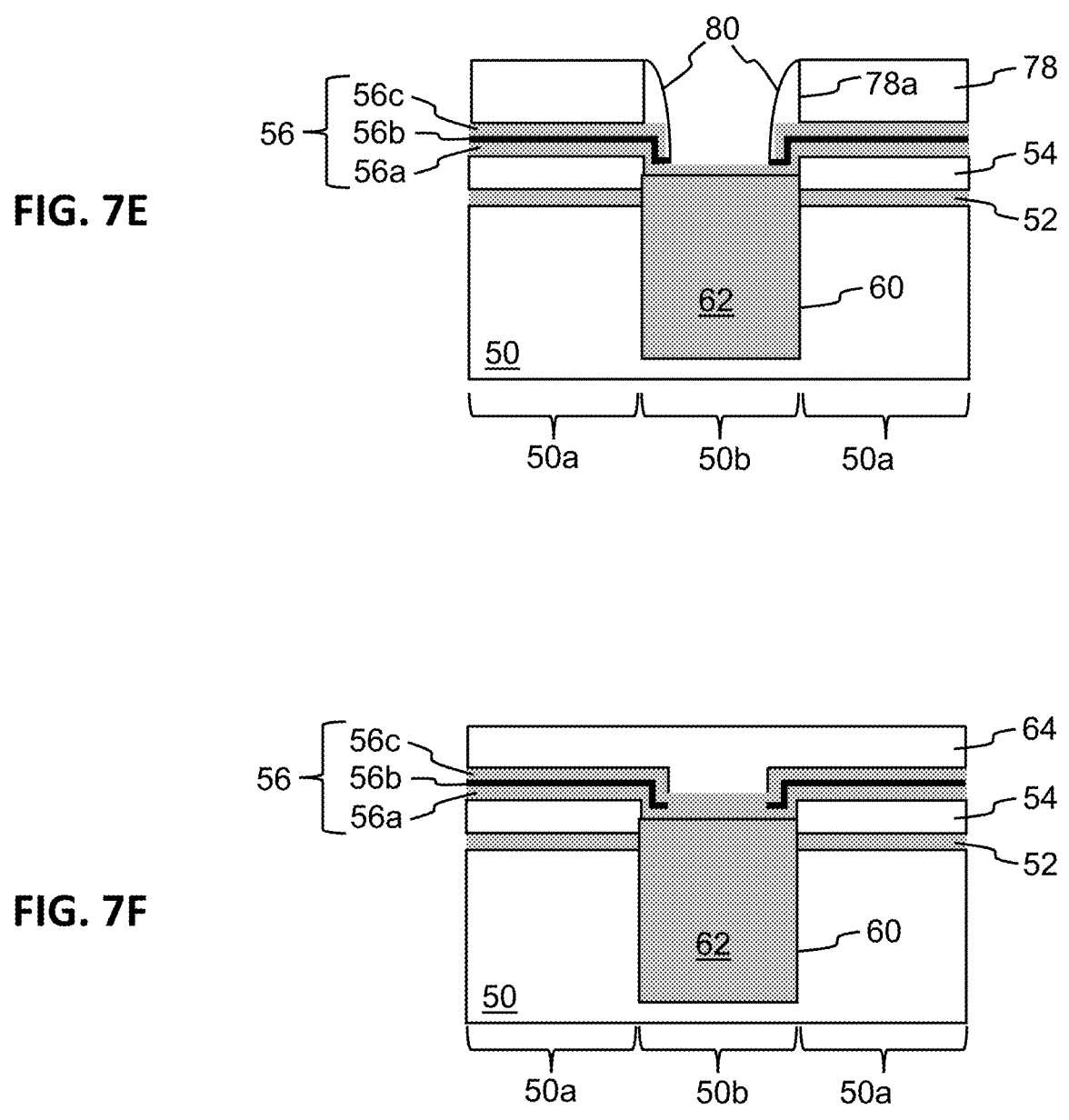

Third insulation layer 78 is formed over the structure, and patterned to create openings 78*a* in the third insulation layer 78 in the isolation regions 50*b* over fill insulation material 62. Oxide deposition and etch are used to form oxide spacers 80 in the openings 78*a*, which removes upper oxide sublayer 56*c* from the isolation regions 50*b*, and leaves nitride sublayer 56*b* exposed in the isolation regions 50*b*. A nitride etch is then used to remove nitride sublayer 56*b* in the isolation regions 50*b*, as shown in FIG. 7E. One or more etches are used to remove oxide spacers 80 and third insulation layer 78. An upper oxide sublayer of the ONO insulation layer is then re-formed on the nitride layer. Second conductive layer 64 can then be formed on the structure, as illustrated in FIG. 7F. At this stage, the first and second conductive layers 54, 64 are insulated from each other by ONO insulation layer 56 in the active regions 50*a*, whereas nitride sublayer 56*b* is mostly omitted from the isolation regions 50*b*. Completion of memory cell formation can be performed by patterning second conductive layer 64 into strips to form control gate lines 64*a* that constitute the control gates 64*b*, forming the source and drain regions 66, 68, followed by additional conductive material deposition and patterning to form the select gate lines 72*a* that constitute the select gates 72, and the erase gate lines 74*a* that constitute the erase gates 74, as described above with respect to FIG. 6.

The above examples have the advantages of combining an ONO insulation layer between the floating gates 54*a* and control gates 64*b* in the active regions and the omission of the nitride sublayer 56*b* of ONO insulation layer 56 in the isolation regions 50*b*, which prevents electron trapping in the ONO insulation layer 56 in the isolation regions 50*b*. One advantage of the example of FIGS. 5A-5D is that ONO insulation layer 56 is self-aligned with the floating gates 54*a*, and the method of fabrication does not require an additional photolithography step. One advantage of the example of FIGS. 7A-7F is that nitride sublayer 56*b* extends partially into the isolation region 50*b* (i.e., beyond the edge of the floating gate 54*a*), due to the formation of spacers 80, which has the added benefit of protecting quality of the lower oxide sublayer of the ONO insulation layer, thus, preventing charge leakage between edge of the floating gate 54*a* and the control gate 64*b*.

It is to be understood that the above is not limited to the examples(s) described above and illustrated herein but encompasses any and all variations falling within the scope of any claims. Any references to the examples or invention herein are not intended to limit the scope of any claim or claim term, but instead merely relate to one or more features that may be covered by one or more of the claims. Further, as is apparent from the claims and specification, not all method operations need be performed in the exact order illustrated or claimed, but rather in any order (unless there is an explicitly recited limitation on any order) that allows the proper formation of the semiconductor device described herein. Materials, processes and numerical examples described above are examples only, and should not be deemed to limit the claims.

What is claimed is:

1. A method, comprising:

forming a first insulation layer on an upper surface of a semiconductor substrate;

forming a first conductive layer on the first insulation layer;

forming a compound insulation layer on the first conductive layer, wherein the compound insulation layer comprises a nitride sublayer between a lower oxide sublayer and an upper oxide sublayer;

forming a second insulation layer on the compound insulation layer;

forming a trench that extends through the second insulation layer, the compound insulation layer, the first conductive layer, the first insulation layer, and into the semiconductor substrate;

filling the trench with fill insulation material;

removing the second insulation layer and an upper portion of the fill insulation material; and forming a second conductive layer on the compound insulation layer, and on the fill insulation material in the trench.

2. The method of claim 1, comprising:

patterning the second conductive layer to form a control gate;

patterning the first conductive layer to form a floating gate under the control gate;

forming a select gate;

forming a source region and a drain region in the semiconductor substrate, wherein a channel region of the semiconductor substrate extends between the source region and the drain region, and wherein the floating gate is disposed over and insulated from a first portion of the channel region and the select gate is disposed over and insulated from a second portion of the channel region; and forming an erase gate over and insulated from the source region.

3. The method of claim 1, wherein the removing the second insulation layer comprises removing the upper oxide sublayer, the method comprising:

re-forming the upper oxide sublayer on the nitride sublayer before the forming of the second conductive layer.

4. A method, comprising:

forming a first insulation layer on an upper surface of a semiconductor substrate;

forming a first conductive layer on the first insulation layer;

forming a second insulation layer on the first conductive layer;

forming a trench that extends through the second insulation layer, the first conductive layer, the first insulation layer, and into the semiconductor substrate;

filling the trench with fill insulation material;

removing the second insulation layer and an upper portion of the fill insulation material;

forming a compound insulation layer on the first conductive layer and on the fill insulation material in the trench, wherein the compound insulation layer comprises a nitride sublayer between a lower oxide sublayer and an upper oxide sublayer;

removing portions of the upper oxide sublayer and the nitride sublayer disposed on the fill insulation material in the trench; and forming a second conductive layer on the compound insulation layer and on the lower oxide sublayer in the trench.

5. The method of claim 4, comprising:

patterning the second conductive layer to form a control gate;

patterning the first conductive layer to form a floating gate under the control gate;

forming a select gate;

forming a source region and a drain region in the semiconductor substrate, wherein a channel region of the semiconductor substrate extends between the source region and the drain region, and wherein the floating gate is disposed over and insulated from a first portion of the channel region and the select gate is disposed over and insulated from a second portion of the channel region; and forming an erase gate over and insulated from the source region.

6. The method of claim 4, wherein the removing of the portions of the upper oxide sublayer and the nitride sublayer comprising:

forming a third insulation layer on the compound insulation layer;

forming an opening in the third insulation layer over the fill insulation material in the trench;

forming spacers in the opening;

removing portions of the upper oxide sublayer and the nitride sublayer between the spacers; and removing the third insulation layer and the spacers.

7. A semiconductor device, comprising:

a semiconductor substrate comprising:

an upper surface, alternating active regions and isolation regions that have lengths extending in a parallel manner in a first direction, and respective ones of the isolation regions include a trench formed into the upper surface, having a length extending in the first direction, and containing fill insulation material filling the trench;

a first strip of conductive material having a length extending in a second direction orthogonal to the first direction and over the active regions and the isolation regions;

a plurality of floating gates disposed over and insulated from the upper surface, wherein respective ones of the floating gates are:

disposed in one of the active regions, between adjacent ones of the isolation regions, disposed under the first strip of conductive material, and insulated from the first strip of conductive material by a compound insulation layer, wherein the compound insulation layer comprises a nitride sublayer between a lower oxide sublayer and an upper oxide sublayer and wherein the nitride sublayer does not extend completely across the isolation regions;

a second strip of conductive material having a length extending in the second direction over the active regions and the isolation regions; and a third strip of conductive material having a length extending in the second direction over the active regions and the isolation regions, wherein the first strip of conductive material is disposed between and insulated from the second strip of conductive material and the third strip of conductive material.

8. The semiconductor device of claim 7, wherein respective ones of the active regions comprises:

a source region;

a drain region, with a channel region of the semiconductor substrate extending between the source region and the drain region;

one of the floating gates is disposed over and insulated from a first portion of the channel region;

the second strip of conductive material is disposed over and insulated from a second portion of the channel region; and the third strip of conductive material is disposed over and insulated from the source region.

9. The semiconductor device of claim 7, wherein the nitride sublayer does not extend into the isolation regions.

10. The semiconductor device of claim 7, wherein the nitride sublayer extends partially into the isolation regions.

* * * * *